United States Patent [19]

Moraveji

[11] Patent Number: 5,374,897
[45] Date of Patent: Dec. 20, 1994

[54] BALANCED, HIGH-SPEED DIFFERENTIAL INPUT STAGE FOR OP-AMPS

[75] Inventor: Farhood Moraveji, Campbell, Calif.

[73] Assignee: National Semiconductor Corporation

[21] Appl. No.: 141,794

[22] Filed: Oct. 21, 1993

[51] Int. Cl.$^5$ .............................. H03F 3/45
[52] U.S. Cl. .................... 330/252; 330/310; 330/255; 330/257
[58] Field of Search ............ 330/252, 257, 255, 288, 330/310; 323/313, 316

[56] References Cited

U.S. PATENT DOCUMENTS 4,901,031  2/1990  Kalthoff ........................ 330/261

FOREIGN PATENT DOCUMENTS 0507388  7/1992  European Pat. Off. ........... 330/261

*Primary Examiner*—James B. Mullins
*Assistant Examiner*—James Dudek
*Attorney, Agent, or Firm*—Patrick T. King

[57] ABSTRACT

A differential input circuit has two halves, each half includes a differential input voltage terminal with a first emitter follower having its base terminal connected to the input terminal, having a collector terminal connected to a first voltage terminal, an emitter terminal connected to a first terminal of an emitter resistor. A second emitter follower is provided having has its base terminal connected to the first differential input terminal, having a collector terminal connected to the first voltage terminal, and having an emitter terminal. A diode-connected transistor is provided having an emitter terminal connected to the emitter terminal of the second emitter follower, having its base and collector terminals connected together. A current source is provided having an output terminal connected to the base and collector terminals of the first diode-connected transistor, and having an input terminal connected to a second voltage terminal. An output drive transistor is provided having its base terminal connected to the base and collector terminals of the first diode-connected transistor, having its emitter terminal connected to the first terminal of the emitter resistor, and having a collector terminal for providing a differential output current.

22 Claims, 6 Drawing Sheets

BALANCED, HIGH-SPEED DIFFERENTIAL INPUT STAGE FOR OP-AMPS

BACKGROUND OF THE INVENTION

1. Field of the Invention

This invention relates to operational amplifier circuits and, more particularly, to improvements in the speed of the differential input stage for an operational amplifier.

2. Prior Art

To increase the slew rate of an operational amplifier while maintaining a fixed unity gain-bandwidth product, $g_m$ can be reduced by using emitter resistors in the input stage to provide emitter degeneration. The emitter resistors reduce the $g_m$ of the amplifier and provide better slew-rate and pulse response. A disadvantage of using emitter degeneration in the input stage is the degradation of the DC performance of the amplifier resulting in lower gain, lower common mode rejection ratio (CMRR), lower power supply rejection ratio (PSRR), and high offset voltage (Vos).

Emitter degeneration can be used along with matched DC current sources so that no DC current flows through the emitter resistor. This provides reduced $g_m$ and improved DC performance, but two matched DC current sources are required, and increased tub capacitance becomes a problem.

FIG. 1 shows a circuit diagram of a basic, prior-art operational amplifier circuit 100. The operational amplifier is a differential amplifier which has two input signal voltages and which provides an output voltage which is proportional to the difference between the two input signal voltages. A differential input stage 102 for this amplifier circuit includes a pair of PNP transistors. The first PNP transistor 104 has a base terminal 105, and emitter terminal 106, and a collector terminal 107. The second PNP transistor 108 has a base terminal 109, and emitter terminal 110, and a collector terminal 111. A differential input voltage $V_{in}$ is applied between the base terminals 105, 109. The emitter terminal 106 has one end of an emitter resistor 112 connected thereto. The other end of the emitter resistor 112 is connected to the output terminal 114 of a constant current source 116. The input terminal 118 of the constant current source 116 is connected to a +Vcc supply voltage. The value of the current from the constant current source 116 is represented as $I_t$. The emitter terminal 110 has one end of another emitter resistor 120 connected thereto. The other end of the emitter resistor 120 is connected to the output terminal 114 of the constant current source 116.

The collector loads for the PNP transistors of the differential input stage 102 are respective transistors of a diode-transistor current mirror circuit 122 formed with a first diode-connected NPN transistor 124 and a second NPN transistor 126. The collector terminal 107 of the first PNP transistor 104 is connected to the collector terminal 128 and the base terminal of the diode-connected NPN transistor 124, which are tied together. The emitter terminal 132 of the diode-connected NPN transistor 124 is connected to a ground voltage terminal 134. The collector terminal 111 of the second PNP transistor 108 is connected to the collector terminal 138 of the NPN transistor 126. The base terminal 138 of the NPN transistor 126 is connected to the base terminal 130 of the NPN transistor 104. The emitter terminal 140 of the NPN transistor 126 is connected to the ground voltage terminal 134.

An output amplifier stage 142 has its input terminal 144 connected to the collector terminal 136 of the NPN transistor 126. An output voltage signal $V_{out}$ is provided at the output terminal 146 of the output amplifier 142. A compensation capacitor $C_c$ represents the capacitance between the input terminal 144 and the output terminal 146 of the amplifier 142.

The slew rate of the operational amplifier circuit 100 is the internally-limited rate of change in output voltage when a large-amplitude step function is applied to the input terminal of an operational amplifier. Slew rate is equal to $I_t/C_c$.

The unity gain-bandwidth product is the frequency range from DC to the frequency where the open-loop gain of an operational amplifier rolls off to a value of one. Unity gain-bandwidth product is approximately $g_m/C_c$.

To increase the slew rate for a fixed unity gain-bandwidth product, $g_m$ is reduced by the using the emitter resistors 112, 120. The emitter resistors 112, 120 provide emitter degeneration which reduces $g_m$ and provides better slew-rate and pulse response. The disadvantage of using emitter degeneration as shown in FIG. 1 is the reduction in DC performance by providing lower gain, lower common mode rejection ratio (CMRR), lower power supply rejection ratio (PSRR), and higher DC offset voltage (Vos).

FIG. 2 illustrates a typical prior-art operational amplifier circuit 200 which provides reduced $g_m$ but with better DC performance than the circuit of FIG. 1. A differential input stage 202 for this amplifier includes a pair of NPN transistors. The first NPN transistor 204 has a base terminal 205, and emitter terminal 206, and a collector terminal 207. The second NPN transistor 208 has a base terminal 209, an emitter terminal 210, and a collector terminal 211. A differential input voltage $V_{in}$ is applied between the base terminals 205, 209. An emitter resistor 212 is connected between the emitter terminal 206 and the emitter terminal 210. A first constant current source 214 has its input terminal 216 connected to the emitter terminal 206 and its output terminal 218 connected to a ground voltage terminal 220. A second constant current source 222 has its input terminal 224 connected to the emitter terminal 210 and its output terminal 226 connected to the ground voltage terminal 220. The collector terminals 207, 211 are connected to the input terminals of a current mirror circuit 228.

This circuit has reduced $g_m$ with improved DC performance. No DC current flows through the emitter resistor 212, but two matched DC current sources 214, 222 are required, and the differential pair needs to drive the two tub capacitances of the current sources 214 and 222.

FIG. 3 shows a circuit diagram of another prior-art operational amplifier 300 having improved slew rate. A differential input stage 302 includes a pair of PNP transistors and a pair of NPN transistors. The first PNP transistor 306 has a base terminal 307, an emitter terminal 308, and a collector terminal 309. The second PNP transistor 310 has a base terminal 311, an emitter terminal 312, and a collector terminal 313. A differential input voltage $V_{in}$ is applied between input terminals 305, 314, which are connected to respective base terminals 307, 311. The emitter terminal 306 has one end of an emitter resistor 316 connected thereto. The other end of the emitter resistor 316 is connected to the output terminal 318 of a constant current source 320. The input terminal 322 of the constant current source 320 is connected to a +Vcc supply voltage. The value of the current from the constant current source 320 is represented as $I_t$. The emitter terminal 312 has one end of another emitter resistor 324 connected thereto. The other end of the emitter resistor 324 is connected to the output terminal 318 of the constant current source 320. The collector terminal 309 of the PNP transistor 306 is connected to a −Vcc supply voltage.

The first NPN transistor 336 has a base terminal 337, an emitter terminal 338, and a collector terminal 339. The second NPN transistor 340 has a base terminal 341, an emitter terminal 342, and a collector terminal 343. The input terminals 305, 314, to which the differential input voltage $V_{in}$ is applied, are also connected to respective base terminals 337, 341. The emitter terminal 338 has one end of an emitter resistor 344 connected thereto. The other end of the emitter resistor 344 is connected to the input terminal 346 of a constant current source 348. The output terminal 350 of the constant current source 348 is connected to a −Vcc supply voltage. The value of the current from the constant current source 348 is represented as $I_t$. The emitter terminal 342 has one end of another emitter resistor 354 connected thereto. The other end of the emitter resistor 354 is connected to the input terminal 346 of the constant current source 348. The collector terminal 339 of the NPN transistor 336 is connected to a +Vcc supply voltage.

The collector terminal 313 of the PNP transistor 310 is connected to the current input terminal 360 of a bottom current mirror circuit 362. The bottom current mirror circuit 362 has a voltage supply terminal 364 which is connected to the −Vcc supply voltage. The collector terminal 343 of the NPN transistor 340 is connected to the current input terminal 366 of a top current mirror circuit 368. The top current mirror circuit 368 has a voltage supply terminal 370 which is connected to the +Vcc supply voltage.

The current output terminal 372 of the top current mirror circuit 368 and the current output terminal 374 of the bottom current mirror circuit 362 are both connected to the input terminal of the output buffer amplifier 378, which has an output terminal 380.

In contrast to the performance of the circuit of FIG. 1, the slew rate for the circuit of FIG. 3 is twice that of FIG. 1, or 2. The two current sources 320, 348 limit the slew rate.

FIG. 4 shows a circuit diagram of a prior-art operational amplifier 400. A differential emitter-follower input stage includes a pair 402 of PNP-NPN emitter-follower transistors and a pair 404 of NPN-PNP emitter follower transistors.

The pair 402 of PNP-NPN transistors includes a first PNP transistor 406 which has its collector terminal 407 connected to a negative voltage supply. Its base terminal 408 is connected to one differential input terminal 409 of the amplifier 400. Its emitter terminal 410 connected to the output terminal 411 of a constant current source 412. The input terminal 413 of the constant current source 412 is connected to a positive voltage supply. The emitter terminal 411 is also connected to the base terminal 414 of an NPN transistor 415. The collector terminal 416 is also connected to the positive voltage supply. The emitter terminal 417 is connected to one terminal 418 of an emitter resister 419.

The pair 402 of PNP-NPN transistors includes a second PNP transistor 420 which has its collector terminal 421 connected to the negative voltage supply. Its base terminal 422 is connected to the other differential input terminal 423 of the amplifier 400. Its emitter terminal 424 is connected to the output terminal of a constant current source 425. The input terminal 426 of the constant current source 425 is connected to the positive voltage supply. The emitter terminal 424 is also connected to the base terminal 427 of an NPN transistor 428. The emitter terminal 429 is connected to the other terminal 430 of the emitter resistor 419.

The collector terminal 431 is connected to an input current terminal 432 of a top current mirror circuit 433. The top current mirror circuit 433 has an output current terminal 434 which is connected to the input terminal 435 of an output buffer amplifier 436 having an output terminal 437.

In a similar manner, the pair 404 of NPN-PNP transistors includes a first NPN transistor 456 which has its collector terminal 457 connected to a positive voltage supply. Its base terminal 458 is connected to the one differential input terminal 409 of the amplifier 400. Its emitter terminal 460 is connected to the input terminal 461 of a constant current source 462. The output terminal 463 of the constant current source 462 is connected to a negative voltage supply. The emitter terminal 461 is also connected to the base terminal 464 of an PNP transistor 465. The collector terminal 466 is also connected to the negative voltage supply. The emitter terminal 467 is connected to the one terminal 418 of an emitter resister 419.

The pair 404 of NPN-PNP transistors includes a second NPN transistor 470 which has its collector terminal 471 connected to the positive voltage supply. Its base terminal 472 is connected to the other differential input terminal 423 of the amplifier 400. Its emitter terminal 474 is connected to the input terminal of a constant current source 475. The output terminal 476 of the constant current source 475 is connected to the negative voltage supply. The emitter terminal 474 is also connected to the gate terminal 477 of an PNP transistor 478. The emitter terminal 479 is connected to the other terminal 430 of the emitter resistor 419.

The collector terminal 481 is connected to an input current terminal 482 of a bottom current mirror circuit 483. The bottom current mirror circuit 483 has an output current terminal 484 which is connected to the input terminal 435 of the output buffer amplifier 436.

One problem with this type of amplifier is that it requires DC-balancing by adjustment of the four constant current sources 412, 425, 462, 475. The $V_{BE}$ voltage drops across the PNP and the NPN transistors are also slightly different and need to be matched to get a low Vos.

SUMMARY OF THE INVENTION

It is therefore an object of the invention to provide an operational-amplifier design with an improved input stage design, which provides: very high slew-rate with small idling currents; AC emitter degeneration to provide better DC input offset voltage Vos characteristics; improved DC common mode rejection ratio (CMRR) and power supply rejection ratio (PSRR); one current source to set the idling current; flexible input drive capability; flexible output drive capability; and adjustable idling current by scaling of the emitter areas of various transistors.

In accordance with this and other objects of the invention, a basic amplifier input circuit is provided. A differential input circuit is formed using two basic amplifier circuits connected to an emitter resistor. An amplifier circuit includes a differential input voltage terminal which is connected to the base terminal of a first emitter follower having a collector terminal and an emitter terminal. A second emitter follower also has its base terminal to the differential input terminal. The second emitter follower also has a collector terminal and an emitter terminal. The emitter terminal of the second emitter follower is connected to one terminal of an emitter resistor. The collector terminals of the first and second emitter followers are connected to a first voltage source. A diode-connected transistor has its base and collector terminals connected together and has its emitter terminal connected to the emitter terminal of the second emitter follower. A current source is provided which has one terminal connected to the base and collector terminals of the first diode-connected transistor. The other terminal of the current source is connected to a second voltage terminal. An output drive transistor has its base terminal connected to the base and collector terminals of the first diode-connected transistor. The emitter terminal of the output drive transistor is connected to the one terminal of the emitter resistor. The collector terminal of the output drive transistor provides a differential output current.

In one embodiment of the invention the first and second emitter followers are PNP transistors and the first diode-connected transistor and the output drive transistor are NPN transistors. In another embodiment of the invention, the first and second emitter followers are NPN transistors and the first diode-connected transistor and the output drive transistor are PNP transistors.

One embodiment of a balanced differential input circuit includes a first PNP transistor which has a base terminal connected to a non-inverting inverting input terminal, a collector terminal connected to a negative voltage supply terminal, and an emitter terminal. A first NPN transistor has its base and collector terminals connected together and has an emitter terminal, where the emitter terminal of the first NPN transistor is connected to the emitter terminal of the first PNP transistor. A first current sources has an output terminal connected to the base and collector terminals of the first NPN transistor and has an input terminal connected to a positive voltage supply terminal. A second PNP transistor has a base terminal connected to the non-inverting input terminal, has a collector terminal connected to the negative voltage supply terminal, and has an emitter terminal. A second NPN transistor has its base terminal coupled to the base terminal of the second PNP transistor. The second NPN transistor has an emitter terminal which is coupled to the emitter terminal of the second PNP transistor and which is coupled to one terminal of an emitter impedance. The collector terminal of the second NPN transistor is connected to a first differential output terminal.

A third PNP transistor has a base terminal connected to an inverting input terminal for the operational amplifier, has a collector terminal connected to a negative voltage supply terminal, and has an emitter terminal. A third NPN transistor has its base and collector terminals connected together and has an emitter terminal connected to the emitter terminal of the third PNP transistor. A second current source has an output terminal connected to the base and collector terminals of the third NPN transistor and has an input terminal connected to the positive voltage supply terminal. A fourth PNP transistor has a base terminal connected to the inverting input terminal for the operational amplifier, has a collector terminal connected to the negative voltage supply terminal, and has an emitter terminal. A fourth NPN transistor has its base terminal coupled to the base terminal of the fourth PNP transistor, has an emitter terminal coupled to the emitter terminal of the fourth PNP transistor which is coupled to the other terminal of the emitter impedance, and has a collector terminal connected to a second differential output terminal.

The first and second PNP transistors have emitters with a given area and the third and fourth PNP transistors have emitters with areas which are n times the given area of the first and the second PNP transistors. The first and second NPN transistors have emitters with a given area and the third and fourth NPN transistors have emitters with areas which are n times the given areas of the first and the second NPN transistors.

Another alternative embodiment of a balanced differential input circuit includes a first NPN transistor having a base terminal connected to a non-inverting input terminal, having a collector terminal connected to a positive voltage supply terminal, and having an emitter terminal. A first PNP transistor has its base and collector terminals connected together and has an emitter terminal, where the emitter terminal of the first PNP transistor is connected to the emitter terminal of the first NPN transistor. A first current source has an input terminal connected to the base and collector terminals of the first PNP transistor and has an input terminal connected to a negative voltage supply terminal. A second NPN transistor has a base terminal connected to the non-inverting input terminal, has a collector terminal connected to the positive voltage supply terminal, and has an emitter terminal. A second PNP transistor has its base terminal coupled to the base terminal of the first PNP transistor, has an emitter terminal coupled to the emitter terminal of the second NPN transistor and coupled to one terminal of an emitter impedance, and has a collector terminal connected to a first differential output terminal. A third NPN transistor has a base terminal connected to an inverting input terminal, has a collector terminal connected to a positive voltage supply terminal, and has an emitter terminal. A third PNP transistor has its base and collector terminals connected together and has an emitter terminal, where the emitter terminal of the third PNP transistor is connected to the emitter terminal of the third NPN transistor. A second current source has an input terminal connected to the base and collector terminals of the third PNP transistor and has an output terminal connected to the negative voltage supply terminal. A fourth NPN transistor has a base terminal connected to the inverting input terminal, has a collector terminal connected to the positive voltage supply terminal, and has an emitter terminal. A fourth PNP transistor has its base terminal coupled to the base terminal of the third PNP transistor, has an emitter terminal coupled to the emitter terminal of the fourth NPN transistor and coupled to another terminal of the emitter impedance, and has a collector terminal connected to a second differential output terminal.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 5:
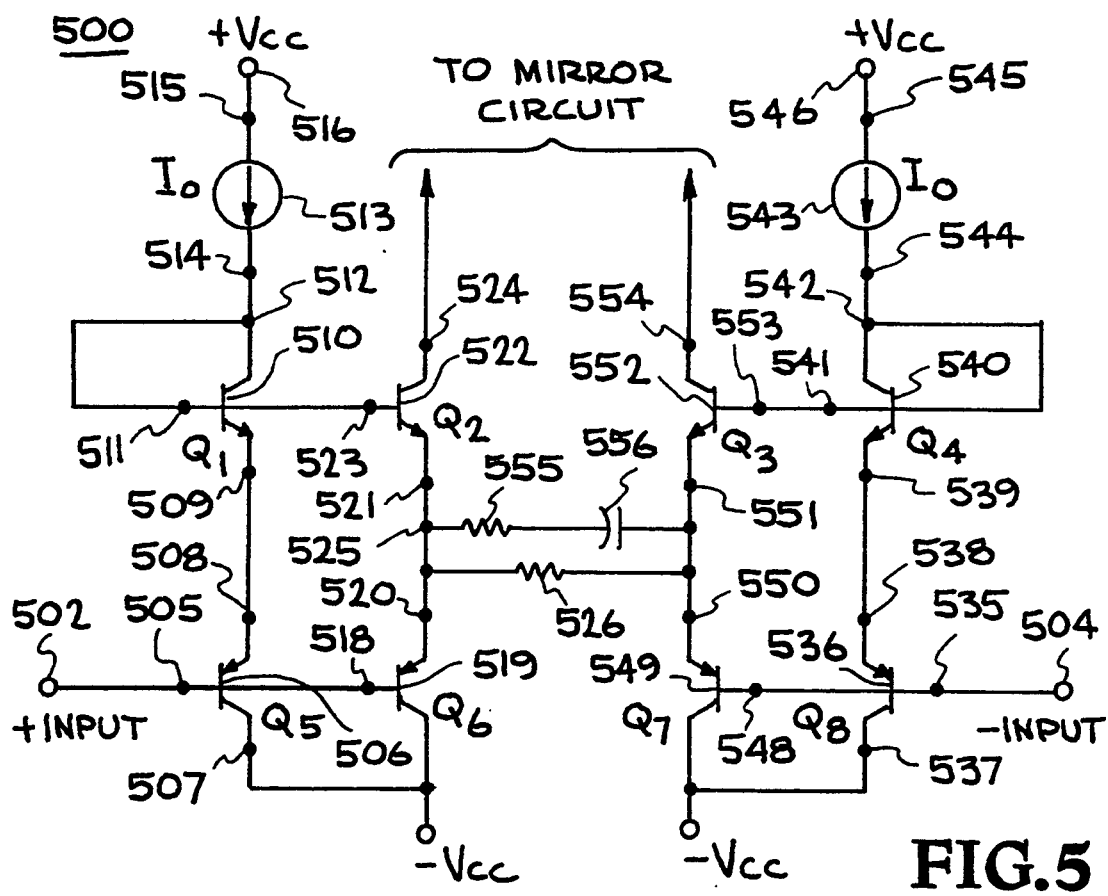
FIG. 5 is a circuit diagram of a differential input stage for an operational amplifier, according to the invention, where the input transistors of the differential input stage uses PNP transistors.

A circuit diagram of an input stage 500 for an operational amplifier, according to the invention, is shown in FIG. 5. The input stage 500 is fabricated as a differential amplifier circuit which has two input terminals 502, 504 for receiving two oppositely-phased input signals.

The non-inverting input terminal 502 is connected to the base terminal 505 of a first PNP transistor 506. The collector terminal 507 of the first PNP transistor 506 is connected to a terminal at which is provided a —Vcc supply voltage. The emitter area of the PNP transistor has an area of "x" units. The emitter terminal 508 of the first PNP transistor 506 is connected to the emitter terminal 509 of a diode-connected NPN transistor 510, which also has an emitter area of "x" units. The base terminal 511 of the diode-connected NPN transistor 510 is connected to its collector terminal 512. A current source 513 has its output terminal 514 connected to the collector terminal 512. The input terminal 515 of the current source 513 is connected to a Vcc voltage supply terminal 516.

The non-inverting input terminal 502 is also connected to the base terminal 518 of a second PNP transistor 519. The collector terminal 520 of the second PNP transistor 519 is also connected to the —Vcc supply voltage terminal. The emitter area of the PNP transistor has an area of "nx" units, or n times larger than the emitter area of the first PNP transistor 506. The emitter terminal 520 of the second PNP transistor 519 is connected to the emitter terminal 52 1 of a second NPN transistor 522, which also has an emitter area of "nx" units. The ratio n scales the idling currents for the various transistors. The base terminal 523 of the NPN transistor: 522 is connected to the base terminal 511 of the NPN transistor 510. The collector terminal 524 provides an output current to, for example, a current mirror circuit.

The emitter terminal 520 of the second PNP transistor 519 and the emitter terminal 521 of the second NPN transistor 522 are both connected to one terminal 525 of an emitter resistor 526.

The inverting input terminal 504 is connected to the base terminal 535 of a third PNP transistor 536. The collector terminal 537 of the third PNP transistor 536 is connected to a terminal at which is provided the —Vcc supply voltage. The emitter area of the third PNP transistor has an area of "x" units. The emitter terminal 538 of the third PNP transistor 536 is connected to the emitter terminal 539 of a second diode-connected NPN transistor 540, which also has an emitter area of "x" units. The base terminal 541 of the second diode-connected NPN transistor 540 is connected to its collector terminal 542. A current source 543 has its output terminal 544 connected to the collector terminal 542. The input terminal 545 of the current source 543 is connected to a Vcc voltage supply terminal 546.

The inverting input terminal 504 is also connected to the base terminal 548 of a fourth PNP transistor 549. The collector terminal 538 of the fourth PNP transistor 549 is also connected to the —Vcc supply voltage terminal 538. The emitter area of the fourth PNP transistor 549 has an area of "nx" units, or n times larger than the emitter area of the third PNP transistor 536. The emitter terminal 550 of the fourth PNP transistor 549 is connected to the emitter terminal 551 of a fourth NPN transistor 552, which also has an emitter area of "nx" units. The base terminal 553 of the NPN transistor 552 is connected to the base terminal 541 of the NPN transistor 540. The collector terminal 554 provides another output current to, for example, a current mirror circuit.

The emitter terminal 550 of the fourth PNP transistor 549 and the emitter terminal 551 of the fourth NPN transistor 552 are both connected to the other terminal of the emitter resistor 526. A resistor 555 and a capacitor 556 are connected in series between the emitter terminals 520, 525 and 550, 551 to provide high-frequency boost for the input differential pair.

The input legs comprising transistors 506, 510, 536, 540 have emitter areas of x units and serve as controllers to control the output legs comprising larger transistors 519, 549, 522, 552.

The input stage 500 for the operational amplifier is a high-speed, class AB input differential pair. The circuit is well balanced for DC voltages and the total current through the differential pair is adjusted by adjusting the current sources and the ratio of the emitter areas nx/x. The input is driven from PNP transistors and the DC idling current can be set to a small value. During a slew operation, the current converter amplifiers converts the input signal to a current and $I_{out}=g_m V_{in}=V_{in}/R$. The maximum current is approximately Beta x $I_o$ and also depends on the value of the emitter resistor, where $I_o$ is the current through the various matched current sources.

One advantage of this circuit over the prior art is that only one current source for each leg of the input stage is necessary. Therefore, component matching is better, the total supply current is less, the response time of the input stage is faster, and the circuit settles more quickly.

Operation of the Circuit of FIG. 5:

The two emitter followers 519, 549 are arranged as a differential pair. The emitter terminals of the emitter followers 519, 549 are given boosts by the currents frown transistors 522, 552, which are provided with base current drive from the respective current sources 513, 543 through the diode-connected transistors 510, 540. The current $\Delta i$ through transistors 522, 552 is $\Delta v$ divided by the value of the emitter resistor (RE) 526. The maximum value of those currents is the current from the current sources 513, 543 multiplied by Beta. For example, if the current from the current sources 513, 543 is 50 microamperes, Beta is equal to 50, and RE is equal to 500 ohm, then the maximum $\Delta v$ is 1.25 volts, which is the maximum differential input voltage that can be applied. By controlling the value of RE, the currents from the current sources, or the value of Beta, the maximum differential input voltage can be controlled.

If a signal applied on input terminal 502 to the base of transistor 506 increases by $\Delta v$, that signal causes the transistor 506 to conduct less. The current through the emitter of transistor 506 will be decreased by $\Delta i$. The voltage at the emitter of transistor 506 goes up by $\Delta v$. Because the constant current source 513 feeds through transistor 5 10 to the emitter of transistor 506, as well as to the base of transistor 522, the excess current from the current source 513 is forced to flow into the base of the base of transistor 522. An increase in current into the base of transistor 522 is multiplied by the Beta of transistor 522 to provide an increased emitter current flowing out of transistor 522. The increased current flows through the emitter resistor 526 and then through the emitter of transistor 549. If the voltage at the base of transistor 506 goes up by $\Delta v$, the voltage at the base of transistor 536 goes down by a similar amount because these transistors are part of a balanced differential amplifier pair.

The limit on how much current transistors 522, 552, and 519, 549 can carry depends on their current gains, Betas, and the current which is available to drive their bases. If the amount of current provided by the current sources 513, 543 is increased, then transistors 522, 552 can provide more current.

An important aspect of the circuit is that the collectors of transistor 512 and 540 are connected as diodes, which causes excess current to be respectively directed to the bases of transistors 522 and 552.

The emitter of transistor 519 and 549 are actually extra emitters so that transistors 506 and 519, as well as transistors 536 and 549, can be one formed as transistor which has one collector but two emitters. The bases can also be the same. The collectors are connected to the −VCC supply voltage.

A preamplifier according to the invention can be designed to handle very large currents because of its Class AB configuration where the output currents are limited only by the current source and the Beta of the transistors 522, 552.

Figure 1:
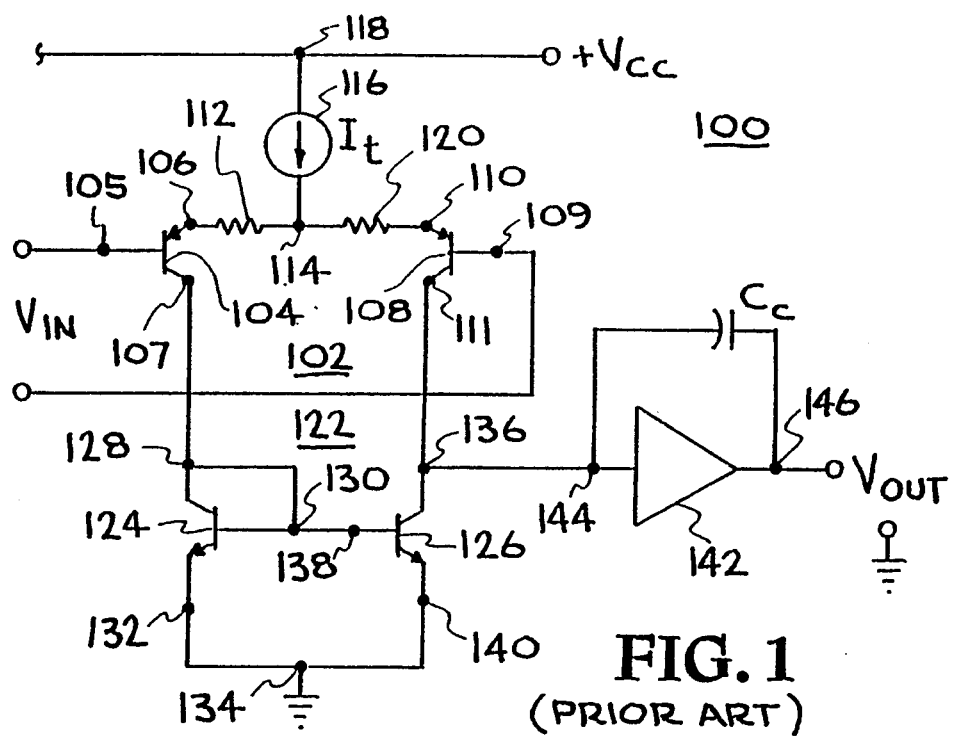
FIG. 1 is a circuit diagram of a basic, prior-art operational amplifier circuit.
Figure 3:
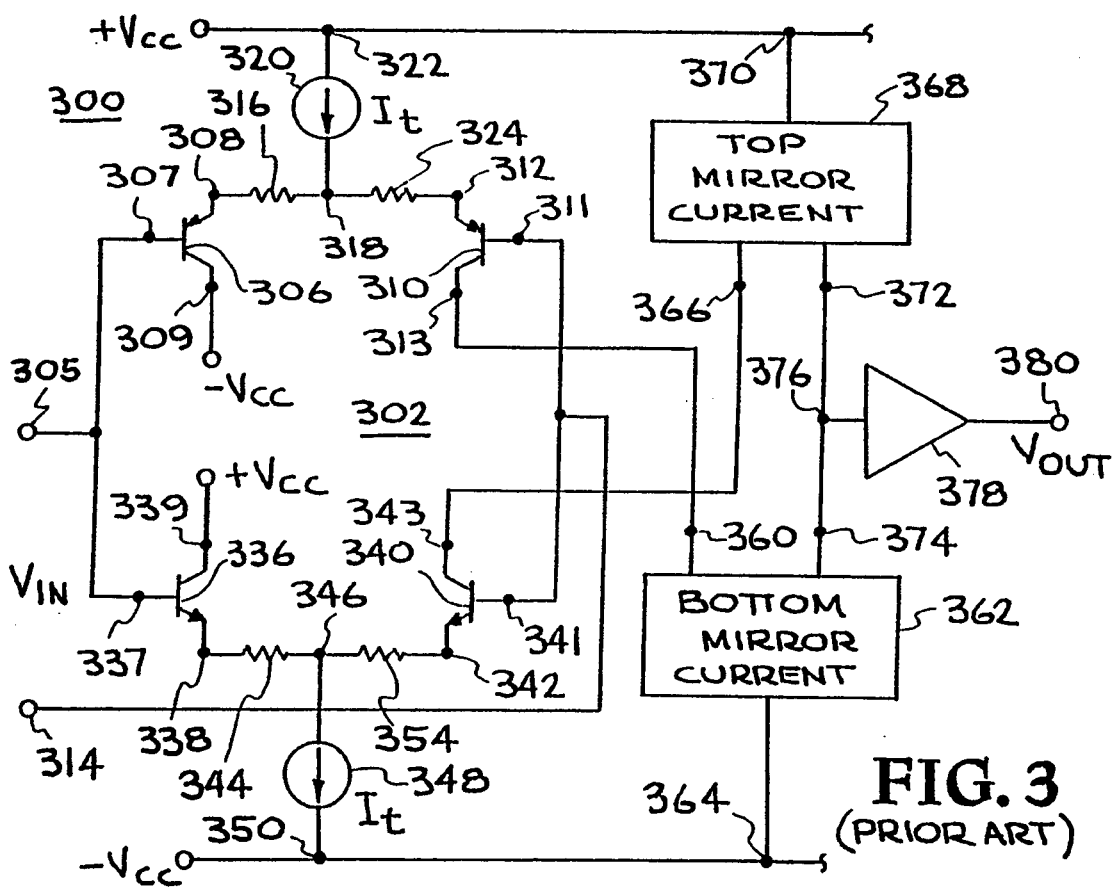
FIG. 3 is a circuit diagram of another prior-art operational amplifier having increased slew rate.
Figure 2:
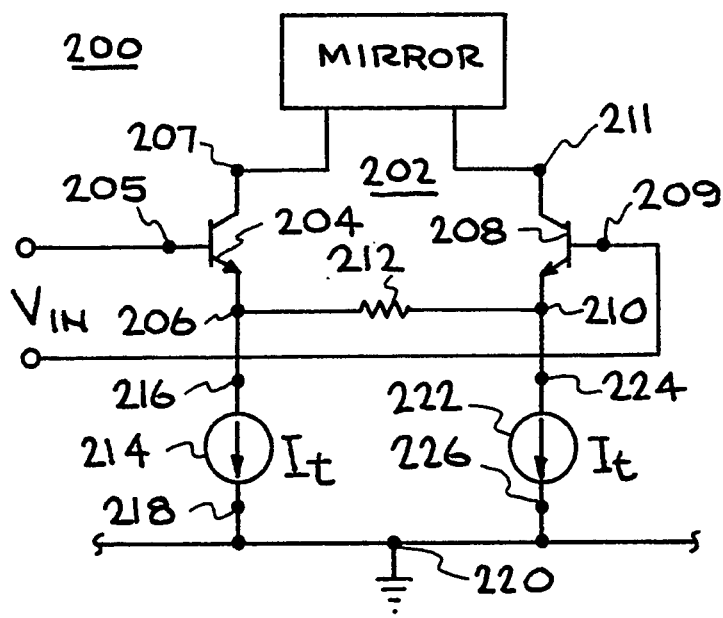
FIG. 2 is a circuit diagram illustrating a typical prior-art method of reducing $g_m$ and providing better DC performance.
Figure 4:
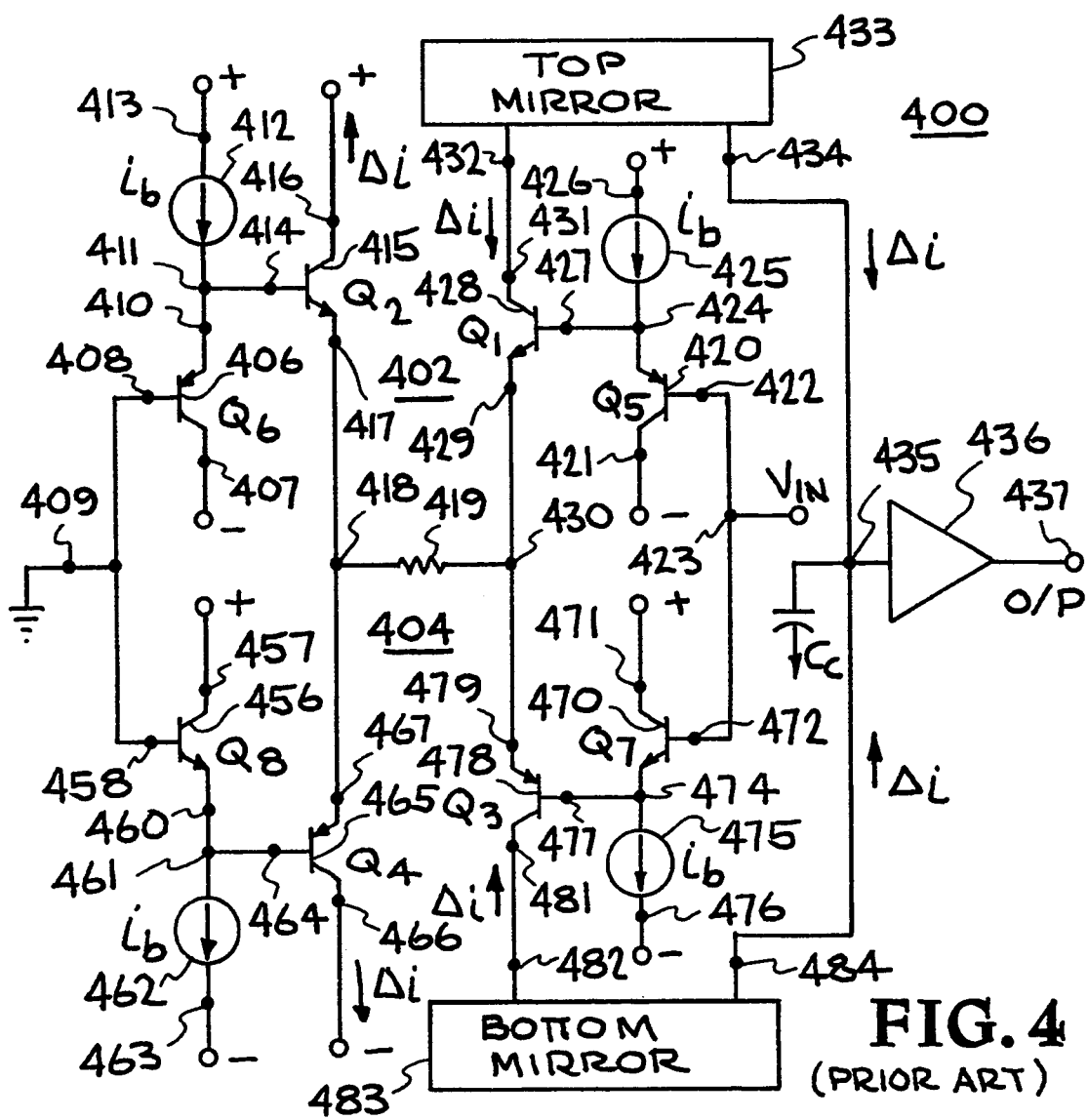
FIG. 4 is a circuit diagram of a high slew rate prior-art differential input stage for an operational amplifier.

Because the invention provides a balanced class AB operation, the DC operation has no current going through the emitter resistor 526. This provides very good VOS, CMRR, and PSRR because there is no DC current flowing through the emitter resistor. Another feature of the invention is that are just two just two current source 513,543, compared to the prior art class AB amplifier of FIG. 4 which requires four current sources, which must be matched to make sure that the DC current through the emitter degeneration resistors are zero. It is difficult to make the current sources of FIG. 4 match because if the current sources are not matched then the base-to-emitter voltages of the transistors would be different. In a circuit according to the invention, transistors 506, 519 as well as transistors 536, 549 are basically one transistor with two emitters in the same transistor. The circuit of FIG. 4 requires that eight transistors be matched.

For the circuit according to the invention, the input signal goes through only one PN emitter voltage drop which has less signal delay. The prior art circuit of FIG. 4 requires going up through a PNP base-to-emitter and down through an NPN base-to-emitter, resulting in greater signal delay. An advantage of the invention is that it has just one junction delay for a signal, while providing sufficient output current.

Figure 6:
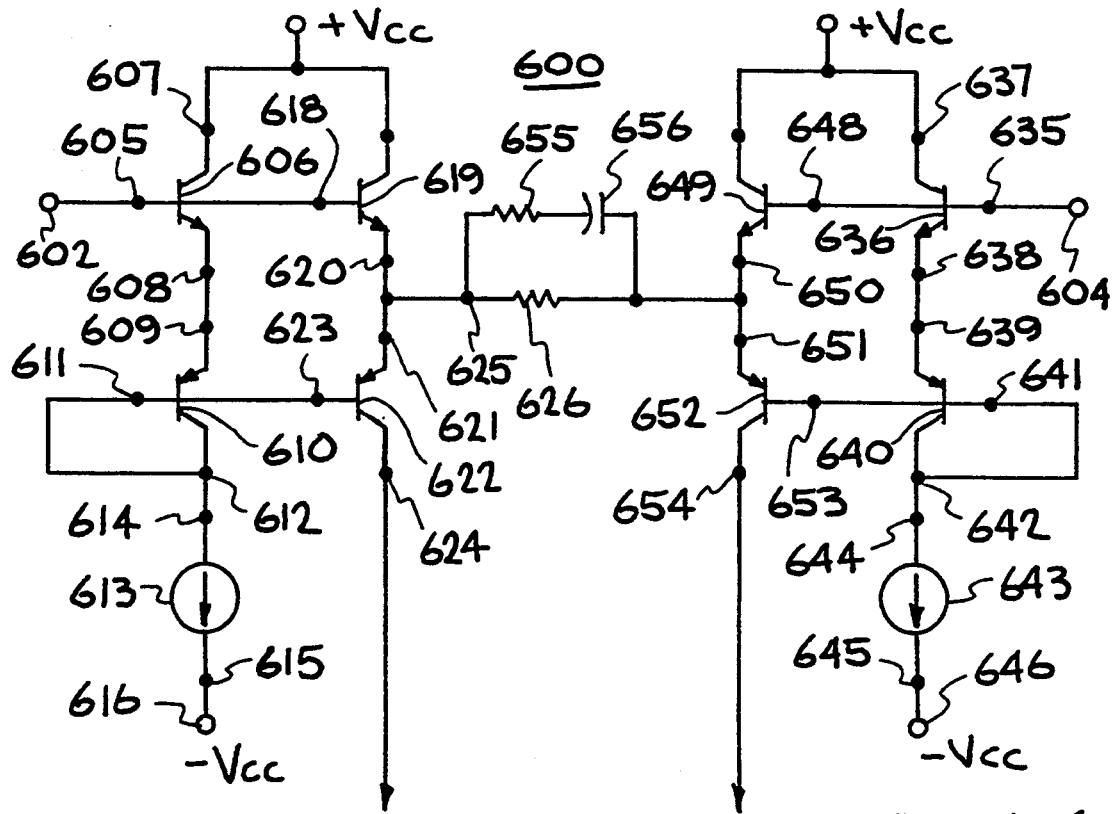
FIG. 6 is a circuit diagram of a differential input stage for an operational amplifier, where the input transistors of the differential input stage uses NPN transistors.

FIG. 6 is a circuit diagram of an alternative embodiment of an input stage 600 for an operational amplifier, according to the invention, which employs NPN input devices and PNP output devices.

In FIG. 6, the current mirrors and their respective outputs are at the bottom of the circuit diagram and the drive signals are at the top of the Figure. One reason for doing this is that sometimes we may want, for example, to couple this type of preamplifier stage to a second stage and we may want to make the signals common mode with respect to either +VCC or −VCC. In the case of FIG. 5, the common mode input is up to −VCC and in FIG. 6 to +VCC.

The input stage is fabricated as a differential amplifier circuit which has two input terminals 602, 604 for receiving two input signals.

The input terminal 602 is connected to the base terminal 605 of a first NPN transistor 606. The collector terminal 607 of the first NPN transistor 606 is connected to a terminal at which is provided the +Vcc supply voltage. The emitter area of the NPN transistor has an area of "x" units. The emitter terminal 608 of the first NPN transistor 606 is connected to the emitter terminal 609 of a diode-connected PNP transistor 610, which also has an emitter area of "x" units. the base terminal 611 of the diode-connected NPN transistor 610 is connected to its collector terminal 612. A current source 613 has its input terminal 614 connected to the collector terminal 612. The output terminal 615 of the current source 613 is connected to a −Vcc voltage supply terminal 616.

The input terminal 602 is also connected to the base terminal 618 of a second NPN transistor 619. The collector terminal 620 of the second NPN transistor 619 is also connected to the +Vcc supply voltage terminal. The emitter area of the NPN transistor has an area of "nx" units, or n times larger than the emitter area of the first NPN transistor 606. The emitter terminal 620 of the second NPN transistor 619 is connected to the emitter terminal 621 of a second PNP transistor 622, which also has an emitter area of "nx" units. The base terminal 623 of the PNP transistor 622 is connected to the base terminal 611 of the PNP transistor 610. The collector terminal 624 provides an output current to a second stage such as, for example, a current mirror output circuit.

The emitter terminal 620 of the second NPN transistor 619 and the emitter terminal 62 1 of the second PNP transistor 622 are both connected to one terminal 625 of an emitter resistor 626.

The second input terminal 604 is connected to the base terminal 635 of a third NPN transistor 636. The collector terminal 637 of the third NPN transistor 636 is connected to a terminal at which is provided the +Vcc supply voltage. The emitter area of the third NPN transistor has an area of "x" units. The emitter terminal 638 of the third NPN transistor 636 is connected to the emitter terminal 639 of a second diode-connected PNP transistor 640, which also has an emitter area of "x" units. The base terminal 641 of the second diode-connected PNP transistor 640 is connected to its collector terminal 642. A current source 643 has its input terminal 644 connected to the collector terminal 642. The output terminal 645 of the current source 643 is connected to a −Vcc voltage supply terminal 646.

The input terminal 604 is also connected to the base terminal 648 of a fourth NPN transistor 649. The collector terminal of the fourth NPN transistor 649 is also connected to the +Vcc supply voltage terminal 638. The emitter area of the fourth NPN transistor 649 has an area of "nx" units, or n times larger than the emitter area of the third NPN transistor 636. The emitter terminal 650 of the fourth NPN transistor 649 is connected to the emitter terminal 651 of a fourth PNP transistor 652, which also has an emitter area of "nx" units. The base terminal 653 of the PNP transistor 652 is connected to the base terminal 641 of the PNP transistor 640. The collector terminal 654 provides another output current to the second stage.

The emitter terminal 650 of the fourth NPN transistor 649 and the emitter terminal 651 of the fourth PNP transistor 652 are both connected to the other terminal of the emitter resistor 626. A resistor 655 and a capacitor 656 are connected in series between the emitter terminals to provide high-frequency boost for the input differential pair.

The input legs comprising transistors 606, 610, 636, 640 have emitter areas of x units and serve as controllers to control the output legs comprising larger transistors 619, 622, 649, 652.

The input stage 600 for the operational amplifier is a high-speed, class AB input differential pair. The circuit is well balanced for DC voltages and the total current through the differential pair is adjusted by adjusting the current sources and the ratio of the emitter areas nx/x. The input is driven from NPN transistors and the DC idling current can be set to a small value. During a slew operation, the current converter amplifiers converts the input signal to a current and $I_{out}=g_m V_{in}=V_{in}/R$. The maximum current is approximately Beta times the output current Io of the current source and also depends on the value of the emitter resistor, where $I_o$ is the current through the various matched current sources.

One of the obvious advantages of this circuit over the prior art is that only one current source for each leg of the input stage is necessary. Therefore the matching is better, the total supply current is less, the response time of the input stage is faster, and the circuit settles quicker. The circuit of FIG. 6 has the same advantages as the circuit of FIG. 5. Because the invention provides a balanced class AB operation, the DC operation has no current going through the emitter resistor 526, which provides very good VOS, CMRR, and PSRR because there is no DC current flowing through the emitter resistor. Just two just two current sources are required and using one transistors with two emitters makes matching easier. The input signal goes through only one PN emitter voltage drop. This has less signal delay than the prior art circuit of FIG. 4 which requires going up through a PNP base-to-emitter and down through an NPN base-to-emitter, resulting in greater signal delay. An advantage of the invention is that it has just one junction delay for a signal and still provides sufficient output current.

Figure 7:
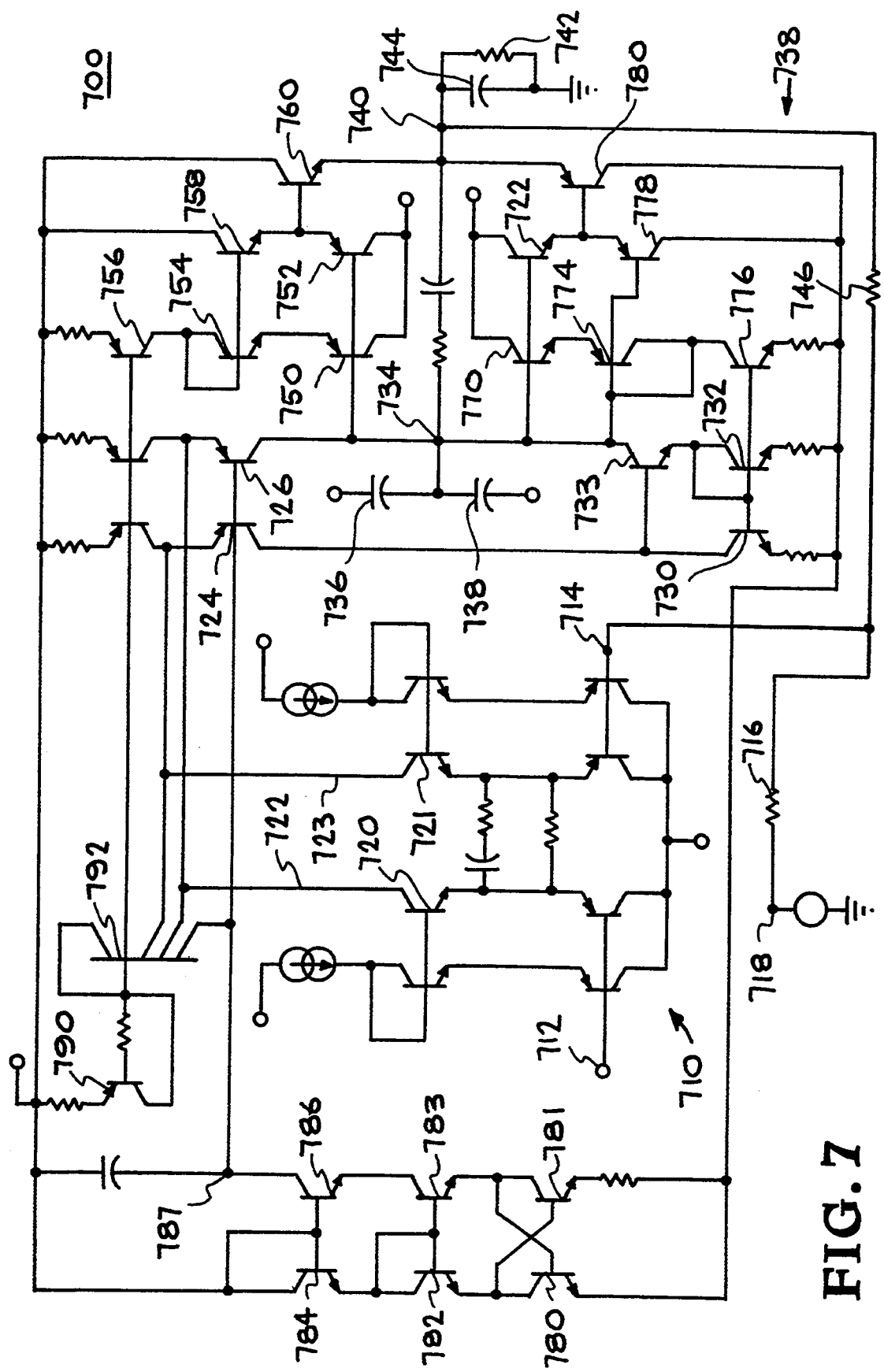
FIG. 7 is a circuit diagram of an entire operational amplifier which uses a differential input stage according to the invention.

FIG. 7 is a circuit diagram of a complete operational amplifier 700 which uses a differential input stage 710, according to the invention. A differential input voltage is applied between the input terminals 712, 714. In this case the input terminal 712 is connected to a ground potential terminal. The input terminal 714 is connected through a series input resistor 716 to an input terminal 718. A single-ended input voltage signal source is connected between the input terminal 718 and a ground terminal.

A differential input voltage applied at the input terminals of the differential input stage 710 is converted by the differential input stage 710 to a pair of differential output currents which are provided from transistors 720 721 on output signal lines 722, 723.

The differential currents on the output signal lines 722, 723 of the differential input stage 710 drive the emitters of two transistors 724, 726. The two transistors 724, 726 are configured as common base amplifiers with their bases tied to ac ground. A folded cascade configuration is formed by the combination of the common-emitter transistors 720, 721 driving the emitters of the common-base transistors 724, 726. If the current through transistor 726 goes up by $\Delta i$, the current through the other transistor 724 goes down by $\Delta i$. The output impedance of transistor 726 is that of a collector circuit and is high-impedance.

Transistors 730, 732, and 733 are configured as a Wilson current mirror with the transistor 733 providing a high-impedance output at its collector. When the current through transistor 724 goes down by $\Delta i$, the current through the transistor 730 also decreases by $\Delta i$. The current through transistor 730 is reflected through transistor 732 of the current mirror and through transistor 733 to a high-impedance summing node 734. When the current through transistor 732 goes down by $\Delta i$, the current at the summing node 734 also goes down by $\Delta i$. When the current through 724 goes down by $\Delta i$, the current through 726 simultaneously increases by $\Delta i$, so that the current into node 734 is two times $\Delta i$, which is provided as a charging or discharging of the compensation capacitors 736, 738, which are connected between the high-impedance summing node 734 and ground.

The signal at the high-impedance node is buffered through output stage of the operational amplifier 700 and appears at output terminal 740. The output terminal 740 of the operational amplifier 700 is typically, for example, connected through a load resistor 742 and load capacitor 744 to a ground terminal. The output terminal 740 is also connected through a feedback resistor 746 to the input terminal 714 of the differential input stage 710 to provide closed loop gain.

Transistors 780–786 form a start-up circuit with a voltage bias generator which sets the currents through the current mirrors. The emitters of multi-emitter, diode-connected transistor 790 in series with the diode-connected transistor 792 clamps the emitters of transistors 724, 726 to two VBEs voltage drops from the supply voltage.

Figure 8:
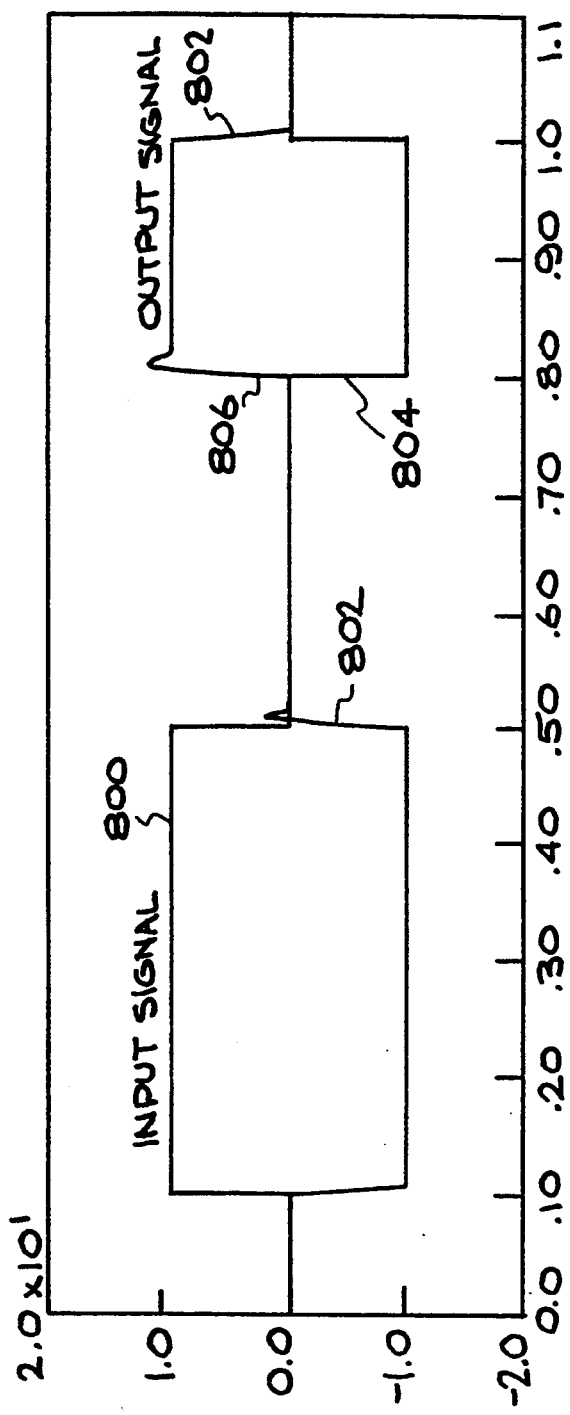
FIG. 8 is a signal wave form diagram which shows a positive input pulse and a negative input pulse, along with the corresponding output signals for the circuit of FIG. 6.

FIG. 8 is a signal wave form diagram showing a 10 volt positive input pulse 800 with a corresponding 10 volt negative output signal 802 for the operational amplifier circuit of FIG. 7, which uses a differential input amplifier according to the invention. FIG. 8 also shows a 10 volt negative input pulse 804 with a corresponding 10 volt positive output signal 806.

Figure 9:
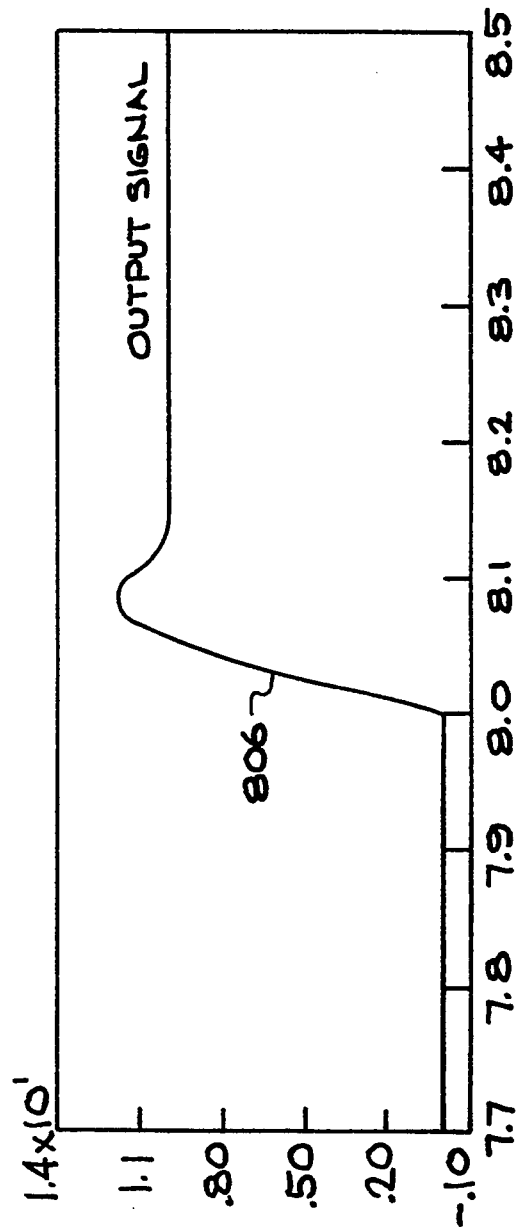
FIG. 9 is an expanded plot of the signal wave form diagram of FIG. 6 with an expanded time scale for the output signal corresponding to a negative input pulse.

FIG. 9 is an expanded plot of the 10 volt positive output signal 806 wave form diagram of FIG. 8. This plot shows that the amplifier has a slew rate of 1700 volts per microsecond.

Figure 10:
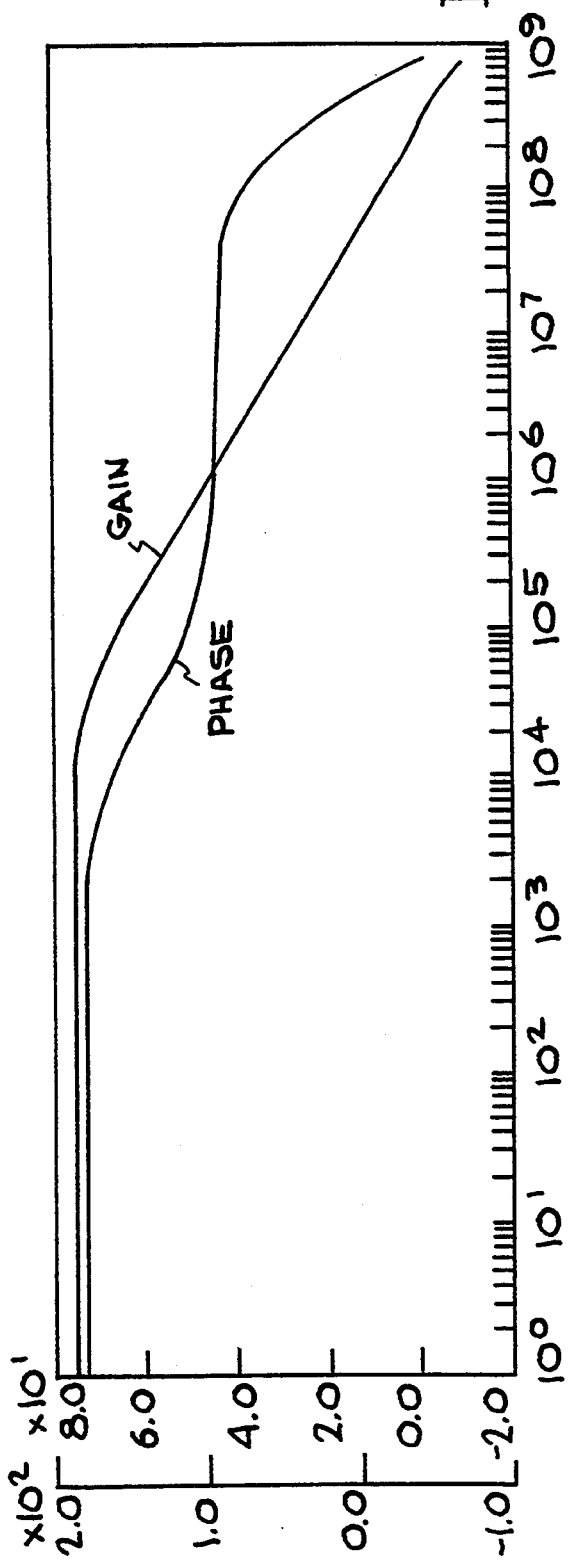
FIG. 10 is a plot of gain and phase as a function of frequency for the operational amplifier of FIG. 6.
Figure 11:
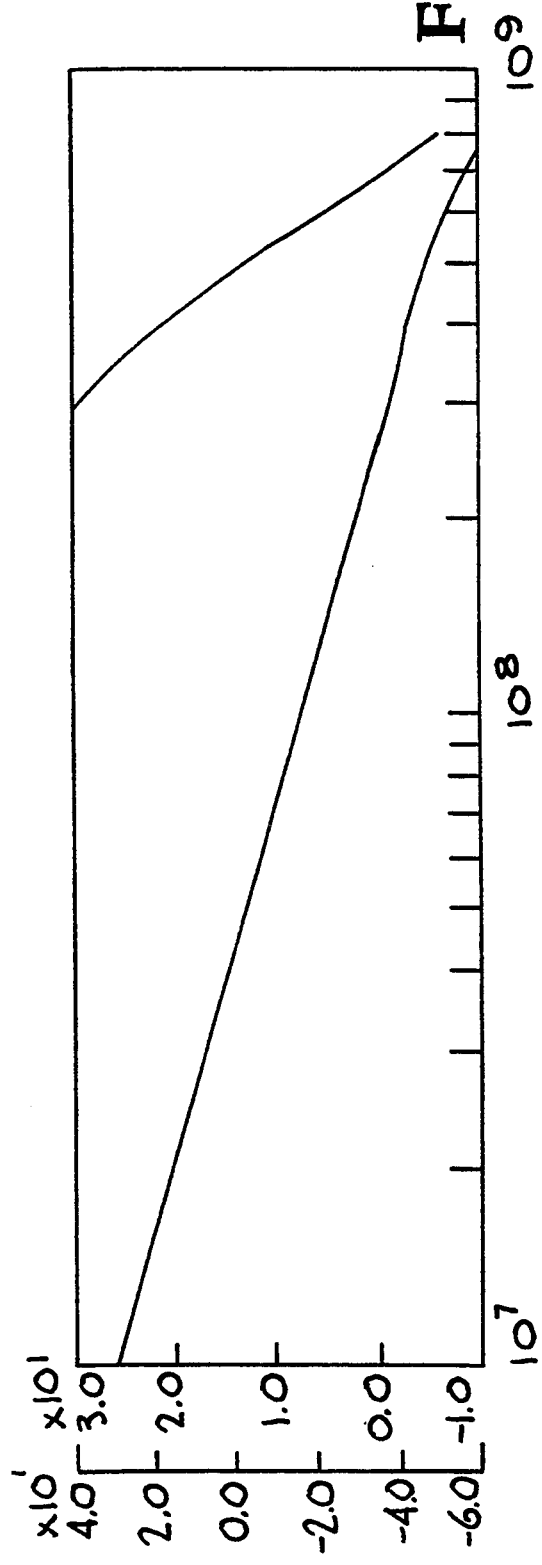
FIG. 11 is an expanded plot of the plot of gain and phase of FIG. 10.

FIG. 10 is a plot of gain and phase for the amplifier of FIG. 7 as a function of frequency. FIG. 11 shows an expanded portion of the plot of FIG. 10, which shows that the bandwidth is 250 MHz and the Phase Margin is 47 degrees.

An input stage according to the invention has a number of advantages. The input stage according to the invention provides for very high slew rate with small idling currents. Emitter degeneration for AC signals provides for an improved Vos. The input stage has improved DC CMRR and PSRR. One current source is used to set the idling current levels. Alternative designs permit input signals and output signals to be taken with respect to either the positive voltage source or the negative voltage source. The idling currents are adjusted by scaling of the emitter areas of the component transistors.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the Claims appended hereto and their equivalents.

I claim:

1. An amplifier circuit, comprising:
   an input terminal;
   a first emitter follower having a base terminal connected to the input terminal, having a collector terminal connected to a first voltage supply terminal, and having an emitter terminal;
   a second emitter follower having a base terminal connected to the input terminal, having a collector terminal connected to the first voltage supply terminal, and having an emitter terminal;
   a first diode-connected transistor having an emitter terminal connected to the emitter terminal of the second emitter follower, said first diode-connected transistor having a base terminal and a collector terminal connected together;
   a current source having a first terminal connected to the base and collector terminals of the first diode-connected transistor, and having a second terminal connected to a second voltage terminal; and
   an output drive transistor having a base terminal connected to the base and collector terminals of the first diode-connected transistor, having an emitter terminal connected to the emitter terminal of the first emitter follower, and having a collector terminal for providing an output load current.

2. The amplifier of claim 1 wherein the first and second emitter followers are PNP transistors and wherein the first diode-connected transistor and the output drive transistor are NPN transistors.

3. The amplifier of claim 1 wherein the first and second emitter followers are NPN transistors and wherein the first diode-connected transistor and the output drive transistor are PNP transistors.

4. The amplifier of claim 1 wherein the first and the second emitter followers are formed as a composite transistor with two emitter regions, one collector region, and one base region.

5. A differential input circuit, comprising:
   a first half of a differential input circuit, including:
      a first differential input voltage terminal;
      a first emitter follower having a base terminal connected to the first differential input terminal, having a collector terminal connected to a first voltage terminal, and having an emitter terminal connected to a first terminal of an emitter resistor;
      a second emitter follower having a base terminal connected to the first differential input terminal, having a collector terminal connected to the first voltage terminal, and having an emitter terminal;
      a first diode-connected transistor having an emitter terminal connected to the emitter terminal of the second emitter follower and having a base terminal and a collector terminal connected together;
      a first current source having a first output terminal connected to the base and collector terminals of the first diode-connected transistor and having a second input terminal connected to a second voltage terminal; and
      a first output drive transistor having a base terminal connected to the base and collector terminals of the first diode-connected transistor, having an emitter terminal connected to a first terminal of an emitter resistor and to the emitter terminal of the first emitter follower, and having a collector terminal for providing a first differential output current; and
   a second half of a differential input circuit, including:
      a second differential input voltage terminal;
      a third emitter follower having a base terminal connected to the second differential input terminal, having a collector terminal connected to the first voltage terminal, and having an emitter terminal connected to a second terminal of the emitter resistor;
      a fourth emitter follower having a base terminal connected to the second differential input terminal, having a collector terminal connected to the first voltage terminal, and having an emitter terminal;
      a second diode-connected transistor having an emitter terminal connected to the emitter terminal of the fourth emitter follower and having a base terminal and a collector terminal connected together;
      a second current source having a first output terminal connected to the base and collector terminals of the second diode-connected transistor, and having a second terminal connected to the second voltage terminal; and a second output drive transistor having a base terminal connected to the base and collector terminals of the second diode-connected transistor, having an emitter terminal connected to the second terminal of the emitter resister and to the emitter of the third emitter follower, and having a collector terminal for providing a second differential output current.

6. The differential input circuit of claim 5 wherein the first, second, third, and fourth emitter followers are PNP transistors, wherein the first and the second diode-connected transistors are NPN transistors, and wherein the first and the second output drive transistors are NPN transistors.

7. The differential input circuit of claim 5 wherein the first, second, third, and fourth emitter followers are NPN transistors, wherein the first and the second diode-connected transistors are PNP transistors, and wherein the first and the second output drive transistors are PNP transistors.

8. The differential input circuit of claim 5 wherein a resistor and a capacitor are connected in series between the terminals of the emitter terminals to provide high-frequency boost for the input differential pair.

9. The amplifier of claim 5 wherein the first and second emitter followers are formed as a composite transistor with two emitter regions, one collector region, and one base region.

10. The differential input circuit of claim 5 wherein the respective collector terminals of the first and second output drive transistors are connected to respective emitter terminals of two common base transistors such that the first and second output drive transistors and the two common base transistors form a balanced folded cascade configuration.

11. A balanced differential input circuit, comprising:
- a first PNP transistor having a base terminal connected to a non-inverting input terminal, having a collector terminal connected to a negative voltage supply terminal, and having emitter terminal;
- a first NPN transistor having its base and collector terminals connected together and having an emitter terminal, where the emitter terminal of the first NPN transistor is connected to the emitter terminal of the first PNP transistor;
- a first current source, having an output terminal connected to the base and collector terminals of the first NPN transistor and having an input terminal connected to a positive voltage supply terminal;
- a second PNP transistor having a base terminal connected to the non-inverting input terminal, having a collector terminal connected to the negative voltage supply terminal, and having an emitter terminal;
- a second NPN transistor having its base terminal coupled to the base terminal of the second PNP transistor, having an emitter terminal coupled to the emitter terminal of the second PNP transistor and coupled to one terminal of an emitter impedance, and having a collector terminal connected to a first differential output terminal;
- a third PNP transistor having a base terminal connected to an inverting input terminal having a collector terminal connected to the negative voltage supply terminal, and having an emitter terminal;
- a third NPN transistor having its base and collector terminals connected together and having an emitter terminal, where the emitter terminal of the third NPN transistor is connected to the emitter terminal of the third PNP transistor;
- a second current source, having an output terminal connected to the base and collector terminals of the third NPN transistor and having an input terminal connected to the positive voltage supply terminal;
- a fourth PNP transistor having a base terminal connected to the inverting input terminal for the operational amplifier, having a collector terminal connected to the negative voltage supply terminal, and having an emitter terminal;
- a fourth NPN transistor having its base terminal coupled to the base terminal of the third NPN transistor, having an emitter terminal coupled to the emitter terminal of the fourth PNP transistor and coupled to another terminal of the emitter impedance, and having a collector terminal connected to a second differential output terminal.

12. The balanced differential input circuit of claim 11 wherein the first and third PNP transistors have emitters with a given area and wherein the second and fourth PNP transistors have emitters with areas which are n times the given area of the first and the second PNP transistors.

13. The balanced differential input circuit of claim 11 wherein the first, and third NPN transistors have emitters with a given area and wherein the second and fourth NPN transistors have emitters with areas which are n times the given areas of the first and the second NPN transistors.

14. The balanced differential input circuit of claim 11 wherein the emitter impedance includes a first resistor.

15. The balanced differential input circuit of claim 11 including another resistor and a capacitor connected in series between the terminals of the emitter impedance terminals to provide high-frequency boost for the input circuit.

16. The balanced differential input circuit of claim 11 wherein the first and the second PNP transistors are formed as a composite transistor with two emitter regions, one collector region, and one base region and wherein the third and fourth PNP transistors are also formed as a composite transistor with two emitter regions, one collector region, and one base region.

17. A balanced differential input circuit, comprising:
- a first NPN transistor having a base terminal connected to a non-inverting input terminal, having a collector terminal connected to a positive voltage supply terminal, and having an emitter terminal;
- a first PNP transistor having its base and collector terminals connected together and having an emitter terminal, where the emitter terminal of the first PNP transistor is connected to the emitter terminal of the first NPN transistor;
- a first current source, having an input terminal connected to the base and collector terminals of the first PNP transistor and having an output terminal connected to a negative voltage supply terminal;
- a second NPN transistor having a base terminal connected to the non-inverting input terminal, having a collector terminal connected to the positive voltage supply terminal, and having an emitter terminal;
- a second PNP transistor having its base terminal coupled to the base terminal of the first PNP transistor, having an emitter terminal coupled to the emitter terminal of the second NPN transistor and coupled to one terminal of an emitter impedance, and having a collector terminal connected to a first differential output terminal;

a third NPN transistor having a base terminal connected to an inverting input terminal, having a collector terminal connected to a positive voltage supply terminal, and having an emitter terminal;

a third PNP transistor having its base and collector terminals connected together and having an emitter terminal, where the emitter terminal of the third PNP transistor is connected to the emitter terminal of the third NPN transistor;

a second current source, having an input terminal connected to the base and collector terminals of the third PNP transistor and having an output terminal connected to the negative voltage supply terminal;

a fourth NPN transistor having a base terminal connected to the inverting input terminal, having a collector terminal connected to the positive voltage supply terminal, and having an emitter terminal;

a fourth PNP transistor having its base terminal coupled to the base terminal of the third PNP transistor having an emitter terminal coupled to the emitter terminal of the fourth NPN transistor and coupled to another terminal of the emitter impedance, and having a collector terminal connected to a second differential output terminal.

18. The balanced differential input circuit of claim 17 wherein the first, second NPN transistors have emitters with a given area and wherein the third and fourth NPN transistors have emitters with areas which are n times the given area of the first and the second NPN transistors.

19. The balanced differential input circuit of claim 17 wherein the first, second PNP transistors have emitters with a given area and wherein the third and fourth PNP transistors have emitters with areas which are n times the given areas of the first and the second PNP transistors.

20. The balanced differential input circuit of claim 17 wherein the emitter impedance includes a first resistor.

21. The balanced differential input circuit of claim 17 including another resistor and a capacitor connected in series between the terminals of the emitter impedance terminals to provide high-frequency boost for the input circuit.

22. The balanced differential input circuit of claim 17 wherein the first and the second NPN transistors are formed as a composite transistor with two emitter regions, one collector region, and one base region and wherein the third and fourth NPN transistors are also formed as a composite transistor with two emitter regions, one collector region, and one base region.

* * * * *